United States Patent [19]

Ning

[11] Patent Number: 5,272,332
[45] Date of Patent: Dec. 21, 1993

[54] LASER DISCRIMINATION DEVICE
[75] Inventor: Xiaohui Ning, N. Providence, R.I.
[73] Assignee: American Optical Corporation, Southbridge, Mass.
[21] Appl. No.: 641,650
[22] Filed: Jan. 15, 1991

Related U.S. Application Data
[63] Continuation-in-part of Ser. No. 507,981, Apr. 11, 1990, abandoned.

[51] Int. Cl.$^5$ .............................................. G02F 1/03
[52] U.S. Cl. ........................... 250/226; 356/346; 250/201.1
[58] Field of Search ............ 250/339, 550, 226, 203.1, 250/203.2, 203.3, 201.1, 216; 356/346, 352; 359/588, 590

[56] References Cited
U.S. PATENT DOCUMENTS

| | | | |
|---|---|---|---|
| 4,508,964 | 4/1985 | Gunning, III et al. | 356/352 X |
| 4,536,002 | 6/1986 | McNally | 356/352 X |
| 4,536,089 | 8/1985 | Siebert | 356/352 |
| 5,023,947 | 6/1991 | Cimini, Jr. et al. | 356/352 X |

Primary Examiner—Tod R. Swann
Attorney, Agent, or Firm—Fishman, Dionne & Cantor

[57] ABSTRACT

A laser discrimination filter based on temporal coherence is presented. This filter comprises a multilayer device with "thick" layers such that the optical thickness of each layer is greater than the coherence length of the ambient light, but still much smaller than the coherence length of the laser light of interest. Thus, the spectral response of the device of this invention becomes dependent on the degree of temporal coherence of the incident light. If white light strikes the filter, multi-beam interference will not occur because of its short coherence length. The device acts like a stack of partially reflecting mirrors. If the laser light strikes the filter, multi-beam interference will still take place because of the long coherence length of the laser light. This causes the device to have different transmitting characteristics for laser light and white light. Therefore, this device functions as a laser discrimination device.

34 Claims, 5 Drawing Sheets

LASER DISCRIMINATION DEVICE

Cross-Reference to Related Application:

This is a continuation-in-part of U.S. application Ser. No. 507,981 filed Apr. 11, 1990 now abandoned.

BACKGROUND OF THE INVENTION

This invention relates to an optical filter for sensing and detecting laser radiation. More particularly, this invention relates to a laser discrimination device which is based on temporal coherence and is not affected by atmospheric turbulence.

In many applications in which lasers are used, sensing, filtering and protection from laser radiation is required. Under certain restricted conditions, features such as wavelength, energy, power, pulse width, repetition rate and polarization, or a combination of those may be utilized to discriminate laser emissions from the background radiation. However, a feature that is truly unique to all lasers is the coherence properties of the radiation field. The light from a laser is both spatially and temporally coherent while that from thermal sources is not. Therefore, for the purposes of laser sensing, filtering and protection, it is highly desirable to have devices that discriminate lasers based on the coherence properties of the incident light. For example, such a device can be used for detecting enemy lasers with unknown frequencies or variable frequencies, e.g. frequency agile lasers.

It is known that the spatial coherence properties of both the laser radiation and the ambient radiation (in the following, the term "ambient light" refers to non-laser light) can change significantly through propagation. The degree of spatial coherence of a laser beam can be dramatically reduced by turbulent atmosphere. Furthermore, it is also known that the light from completely unrelated emitting atoms (molecules) can become spatially coherent if the propagation distance is large. This fact implies that it may not be possible to design a laser discriminating device based on the spatial coherence of the incident light. However, the temporal coherence of lasers is not distorted by natural propagation effects. Therefore, devices relying on the detection of the temporal coherence of the incident light are most desirable. In the past, several devices that use the temporal coherence of the incident light have been investigated. They were all based on the Fabry-Perot interferometers.

A Fabry-Perot etalon interferometer consists normally of two plane, parallel partially reflecting surfaces formed on a solid glass spacer so that one portion of incident radiation is transmitted directly through while other portions, being reflected between the partially reflecting surfaces before emerging, are transmitted over a longer path. Examples of laser sensing devices based on Fabry-Perot etalon are described in U.S. Pat. Nos. 3,824,018, 4,536,081, 4,536,089 and 4,600,307.

Unfortunately, the applications and performance of the known etalon devices are limited by the intrinsic design of the Fabry-Perot interferometer. Accordingly, there is a need for improved laser sensing devices whose performance are based on temporal coherence.

SUMMARY OF THE INVENTION

The above-discussed and other drawbacks and deficiencies of the prior art are overcome or alleviated by the new and improved laser discriminating device of the present invention. In accordance with the present invention, a multilayer structure is used for achieving discrimination based on temporal coherence.

Well known multilayer thin film filters function on the principle of multiple beam interference. The layers are very thin, typically a quarter wave (or approximately 0.1 micron for filters operating in the visible). Laser radiation or white light is coherent over such dimensions and therefore multi-beam interference occurs for all light. In contrast to the prior art and in accordance with the present invention, thicker layers (e.g., typical optical thickness is about 5-100 microns in visible range of spectrum, but may be larger in infrared part of spectrum) are used to construct a multilayer device wherein the response of the device will depend on the coherence length of the incident light. In particular, if the optical thickness of each layer in a multilayer device is greater than the coherence length of white light, such a multilayer device will appear like a stack of broad band reflectors to white light and there will be no interference between the multiple reflected beams. The multiple reflections will reduce the transmittance of the stack essentially uniformly across the spectrum and the transmittance will be essentially independent of the wavelength. If the coherence length is greater than the thickness of the individual layers, interference effects will result in either a high transmittance or low transmittance depending on wavelength and angle of incidence. The difference in the response of the filter as a function of coherence length allows laser radiation to be distinguished from background "white" light.

The multilayer laser discrimination device of this invention is extremely flexible, both in terms of performance and application, particularly when compared to the prior art two layer Fabry-Perot interferometer. The present invention finds utility, for example, as a laser sensor and a laser filter/enhancer. In laser sensor applications, a compact, versatile and high performance microsensor may be constructed having a wide wavelength and angular operating range; and which does not require the use of moving parts. This laser sensor can be used to detect even very weak lasers and provide the basis for threat analysis and optical countermeasures. When constructed as a laser filter/enhancer, the present invention has the ability to block white background light with a high efficiency thereby allowing this filter to be used as a contrast enhancement filter which increases the signal to noise ratio for detectors that are designed to receive laser light such as detectors or films.

The sensitivity of the multilayer laser discrimination device of this invention can be further increased by the incorporation of one or more "active" layers into the multilayer stack. Such "active" layers include piezoelectric materials (e.g. quartz) and electro-optic materials (e.g., $LiNbO_3$, $BaTiO_3$). The active layer(s) is sandwiched between a pair of electrodes. By applying a periodic external electric field to the electrodes, the optical thickness of the active layer(s) is modulated. The modulation in optical thickness causes a modulation in the transmittance for the laser light while the transmittance for background light remains constant. The resultant modulated signal is relatively easy to detect electronically using, for example, a narrow bandpass filter centered at the modulation frequency.

In still another embodiment of this invention, the alternating layers of high index of refraction materials are replaced with thin quarterwave layers deposited using known thin film deposition techniques.

The above-discussed and other features and advantages of the present invention will be appreciated and understood from the following detailed description of the drawings.

BRIEF DESCRIPTION OF THE DRAWINGS

Referring now to the drawings, wherein like elements are numbered alike in the several FIGURES.

DESCRIPTION OF THE PREFERRED EMBODIMENT

Figure 1:
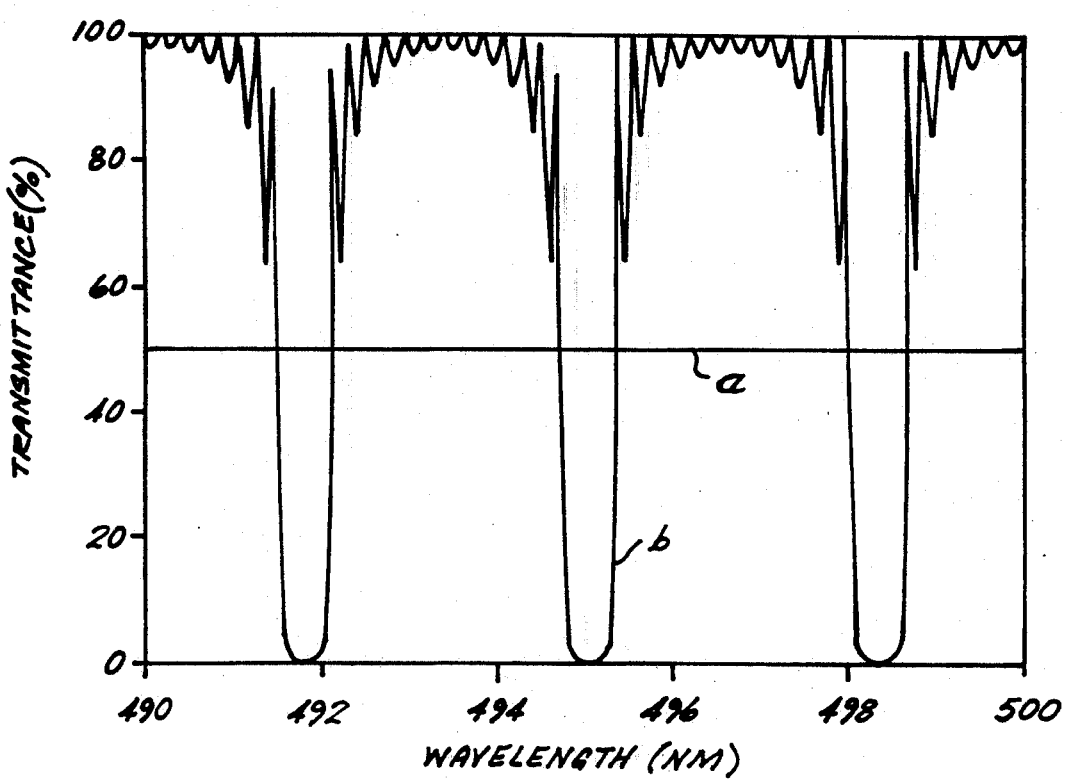
FIG. 1 is a spectrum showing wavelength versus transmittance at normal incidence for a laser discrimination device having 50% transmittance for white light.

Light comprises wave trains (or photons) emitted by the atoms or molecules of the sources. The length of the wave train is inversely proportional to the spectral width of the emitter and is always finite. White light (from a thermal source) has a broad spectral width and emits very short wave trains. Laser light generated by stimulated emission has a very narrow linewidth and therefore the length of the wave train is very long. It will be appreciated that the coherence length can be essentially defined as the length of the wave train. The difference in the wave train length between laser radiation and white light forms the basis for the temporal coherence discrimination device of this invention.

The temporal coherence discrimination device of the present invention comprises a multilayer structure having "thick" layers wherein the optical thickness of each of the layers is greater than the coherence length of the background light and significantly smaller than the coherence length of the laser light. It will be appreciated that multilayer optical structures have been known. However, such multilayer structures in their conventional forms have "thin" layers and are used as spectral filters such as anti-reflection coatings, narrow band reflectors, edge filters, bandpass filters, etc. In these applications, the average layer thickness is much smaller than the average coherence length of the ambient light, and thus, multi-beam interference takes place between the reflected and transmitted light from each interference. The unique spectral properties of these prior art devices are the results of this interference.

In contrast to the known multilayer devices of the prior art, the present invention comprises a multilayer device with "thick" layers such that the optical thickness is greater than the average coherence length of the ambient light, but still much smaller than that of the laser light of interest. Thus, the spectral response of the device of this invention becomes dependent on the degree of coherence of the incident light. If the laser light strikes the filter, multi-beam interference will still take place because of the long coherence length of the laser light. The amplitude of the reflected light is the amplitude superposition of all the reflected beams. This is known as coherent superposition. However, the spectral response of such a device to the ambient light can be very different. The reflected and transmitted beams at the laser interfaces do not have constant phase relation and the multi-beam interference that occurs with the laser light cannot take place between these beams. In the extreme case, one can assume that the reflected and transmitted beams at the laser interfaces are completely uncorrelated. Then the intensity of the combined reflected beam is the intensity superposition of all the reflected beams. This is known as incoherent superposition. As a result, the present invention's spectral response to the ambient light is different from that to the laser light. Therefore, such a device can be used to discriminate the incident light by the coherence length. Because of this unique capability, the present invention may be called a "photon sieve" or a "light sieve".

FIG. 1 shows the transmittance characteristics of a photon sieve configuration with 50% transmittance for white light at normal incidence. White light transmittance for laser light (represented by curve "b") oscillates between essentially 0% to 100% as a function of laser wavelength. For example, this configuration can be obtained by having 14 layers of alternate high and low refractive index materials. In this particular design, the high index material has an index of refraction of 2.30. The low index material has an index of refraction of 1.38. The optical thickness of the layers is 37.5 microns.

Figure 2:
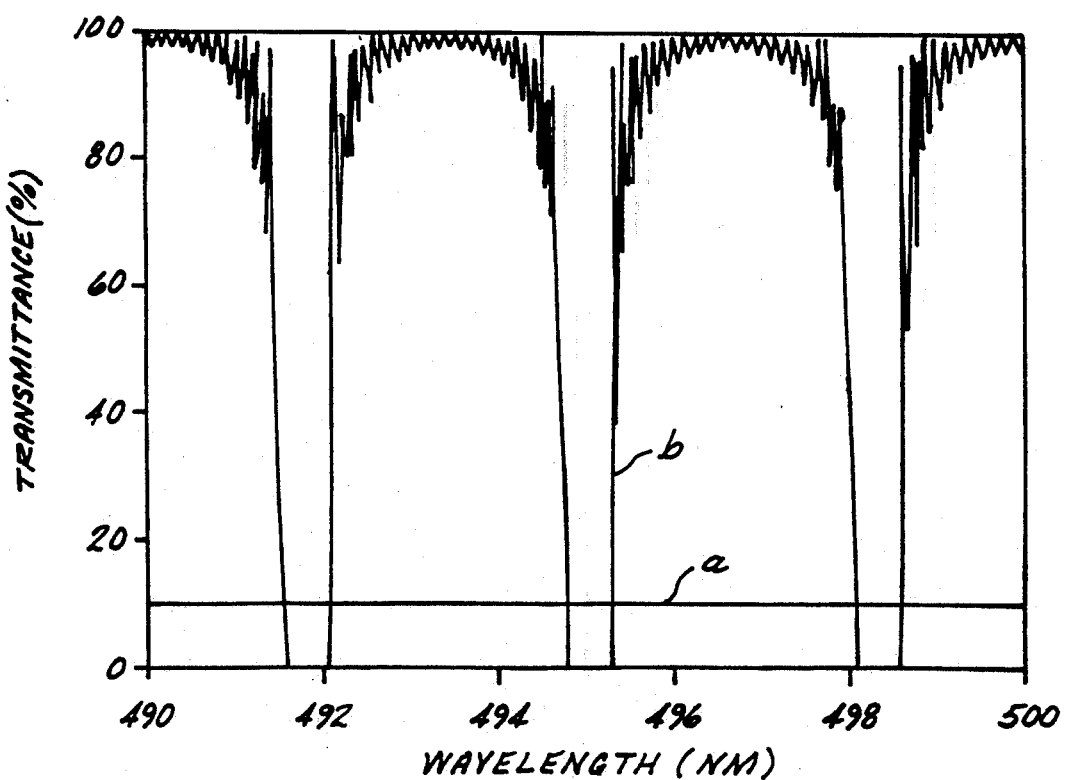
FIG. 2 is a spectrum showing wavelength versus transmittance at normal incidence for a laser discrimination device having 10% transmittance for white light.

In a second embodiment as shown in FIG. 2, the photon sieve transmits only 10% of white light. Its transmittance for laser light is essentially similar to that of the first embodiment (FIG. 1). This second configuration can be obtained by using 130 layers of alternate high and low refractive index materials while other characteristics are identical to that of the first embodiment. The common characteristics of both examples are: (a) Both have high or significant discrimination efficiency, defined as the difference in the transmittance between laser light and white light (e.g., 50% for FIG. 1 and 90% for FIG. 2); (b) they both have well defined reflecting and transmitting bands with short transition regions between them. These characteristics make the photon sieve filters of this invention superior to Fabry-Perot etalons.

Figure 3:
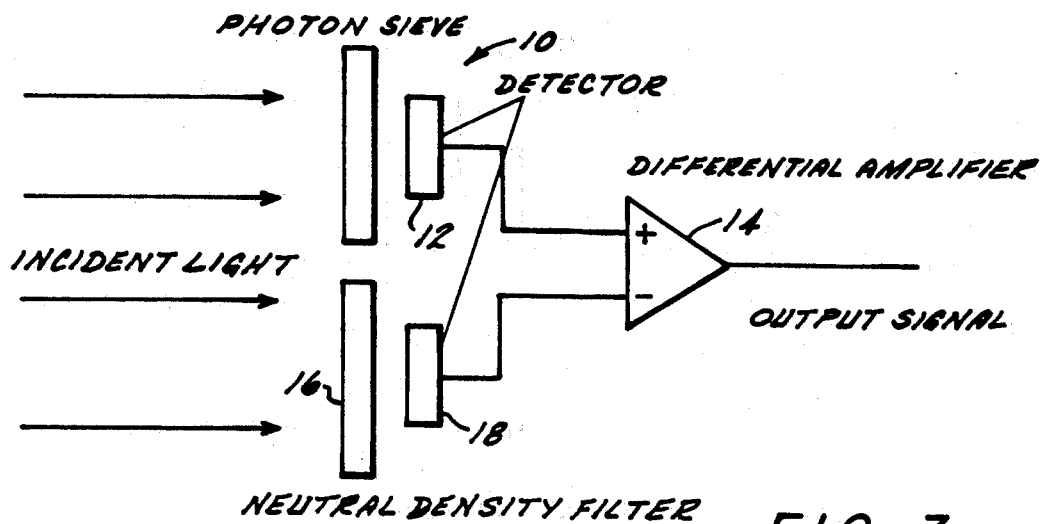
FIG. 3 is a schematic diagram depicting a first embodiment of a laser sensor in accordance with the spectrum of FIG. 1.

Referring now to FIG. 3, a schematic diagram is shown for a laser sensor in accordance with the present invention. The sensor of FIG. 3 utilizes a photon sieve having 50% white light transmittance (see FIG. 1). This laser sensor includes a "photon sieve" comprised of a multilayer stack of "thick" layers as described above and identified at 10. A known photodetector 12 is placed behind the photon sieve 10 in order to detect the transmitted light through the photon sieve 10. The output of detector 12 is fed into a comparator 14. Comparator 14 may comprise a differential amplifier 14. A known neutral density filter 16 having a transmittance of 50% is arranged in a coplanar fashion with photon sieve 10. A photo detector 18 is placed behind neutral density filter 16 to detect the light transmitted through filter 16 as a means to provide a reference signal. The reference signal from photodetector 18 is also fed into comparator 14. Thus, when incident light is encountered by the photon sieve and neutral density filter, a reference beam will be provided by the output from the neutral density filter 16 which may then be compared with the transmitted beam through the photon sieve 10.

Figure 3A:
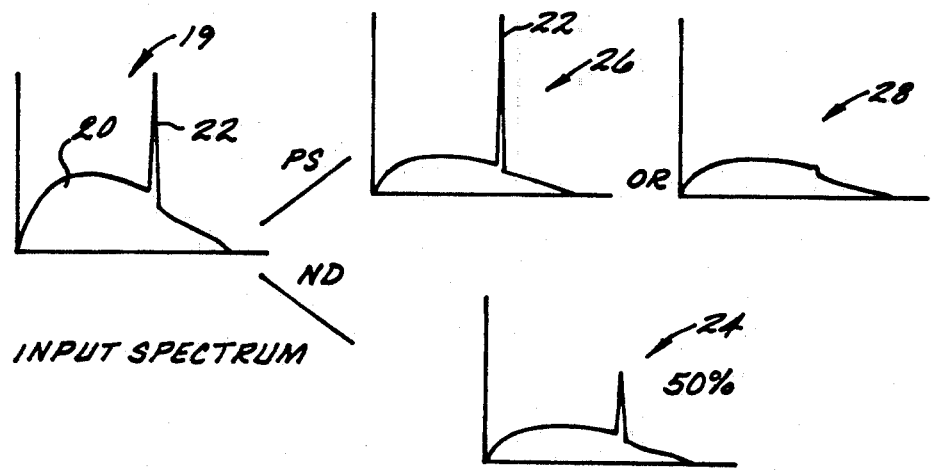
FIG. 3A is a diagrammatic view illustrating the detection logic for the laser sensor of FIG. 3.

In general, the neutral density filter will have transmittance equal to the transmittance of the photon sieve for white (ambient) light. In the FIG. 3 embodiment, the neutral density filter 16 will transmit 50% of both laser and white light. However, the transmittance of the photon sieve depends on whether the incident light is laser light or white light. If the incident light is laser light, the transmittance will be either essentially zero % or 100% depending on wavelength (see FIG. 1 where laser light transmittance is 0% at a wavelength of 495 nm and 100% at a wavelength of 496 nm). If the incident light is white, the transmittance of the white light will be 50% as in the neutral density filter. Therefore, by comparing (using differential amplifier 14) the output from detector 12 with the output from detector 18, the presence or absence of laser light will be detected. This detection principal is illustrated in FIG. 3A where an input spectrum 19 containing both background white light 20 and laser light 22 is passed through neutral density filter 16 and photon sieve 10. As discussed above, the output from the neutral density filter is shown at 24 which depicts a spectrum which is 50% of spectrum 19. In contrast, the output from photon sieve 10 comprises either spectrum 26 or spectrum 28. In both cases, the white light component of the spectrum is reduced by 50% (as in spectrum 24). In addition and depending on wavelength of the laser, the laser component will either be transmitted completely (spectrum 22) or reflected completely (spectrum 28). Thus, by comparing spectrum 24 to either spectrums 26 or 28, laser light may be easily detected.

Figure 4:
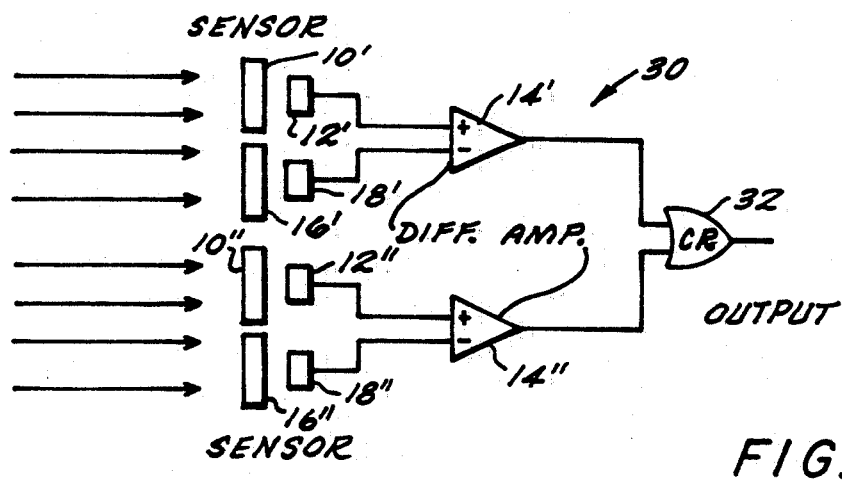
FIG. 4 is a schematic diagram depicting a second embodiment of a laser sensor in accordance with the spectrum of FIG. 2.

Turning now to FIG. 4, a second embodiment of a laser sensor 30 is shown. The FIG. 4 laser sensor has the 10% white light transmittance characteristics of FIG. 2. Sensor 30 essentially comprises a pair of the FIG. 3 sensors (identified as Sensor A and Sensor B). Thus, Sensor A comprises a coplanar photon sieve 10' and neutral density filter 12' connected to a respective photodetector 12' and 18'; which in turn are connected to a differential amplifier 14'. Similarly, Sensor B includes the same components as is clearly shown in FIG. 4. Both Sensors A and B provide the inputs to an OR logic unit 32.

Figure 5A:
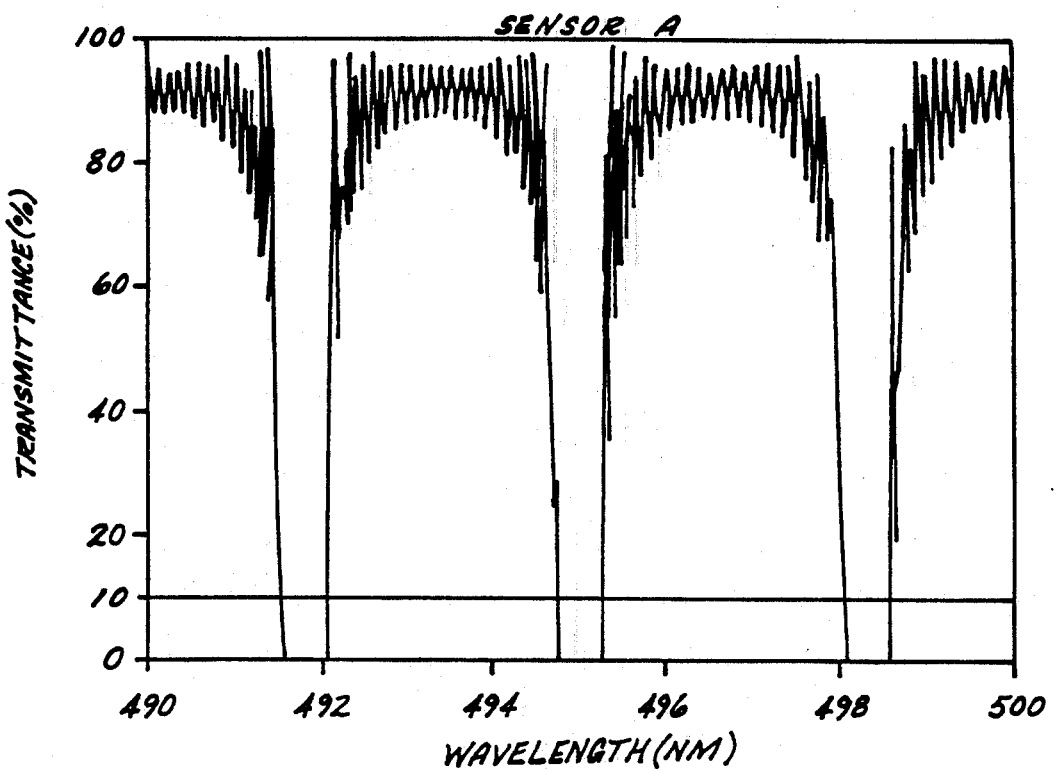
FIGS. 5A and 5B are spectrums for sensors A and B of FIG. 4.
Figure 5B:
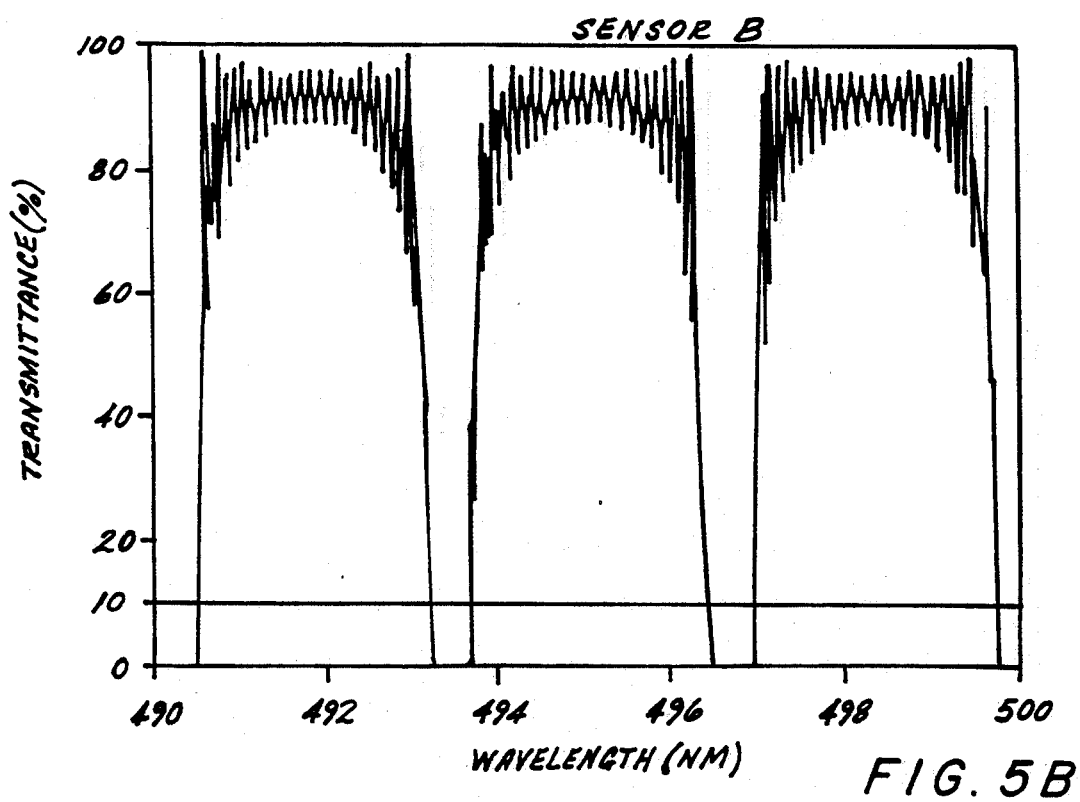

The need for a pair of Sensors A and B will be understood from the following discussion. As is apparent from a review of FIG. 2, at 10% transmittance, a sensor as described in FIG. 3 will exhibit markedly distinct spectrums in the wavelengths where laser light transmittance is essentially 100% (e.g., 493 nm and 494 nm) since the transmittance of the white light is so low (10%). However, in those wavelength ranges where laser light transmittance is small (e.g., 492 nm), the difference between the laser light and white light transmittance is also small and therefore it is difficult to obtain high discrimination. This problem is overcome by using the dual sensors of FIG. 4 and modifying and offsetting the wavelength characteristics of the filters as shown in FIGS. 5A and 5B where the wavelength characteristics of photon sieve 10' in Sensor A is compared to the wavelength characteristics of photon sieve 10" in Sensor B. Thus, for example, while Sensor A may have difficulty in detecting the presence or absence of a laser having a wavelength of 492 nm (due to a small difference output from differential amplifier 14'), Sensor B will clearly detect such a laser because of the much larger difference detected by amplifier 14" (since at 492 nm, photon sieve 10" in Sensor B will transmit essentially 100% of laser light compared to 10% of white light). Modifying a photon sieve to obtain offsetting or shifted transmission spectrums may be easily accomplished by increasing or decreasing the optical thickness of the layers by an equal amount to a quarter of the main wavelength. Thus, for example, the optical thickness of the layers of photon sieve 10" in Sensor B will differ by ¼ wavelength from the optical thickness of photon sieve 10' in Sensor A.

Figure 6:
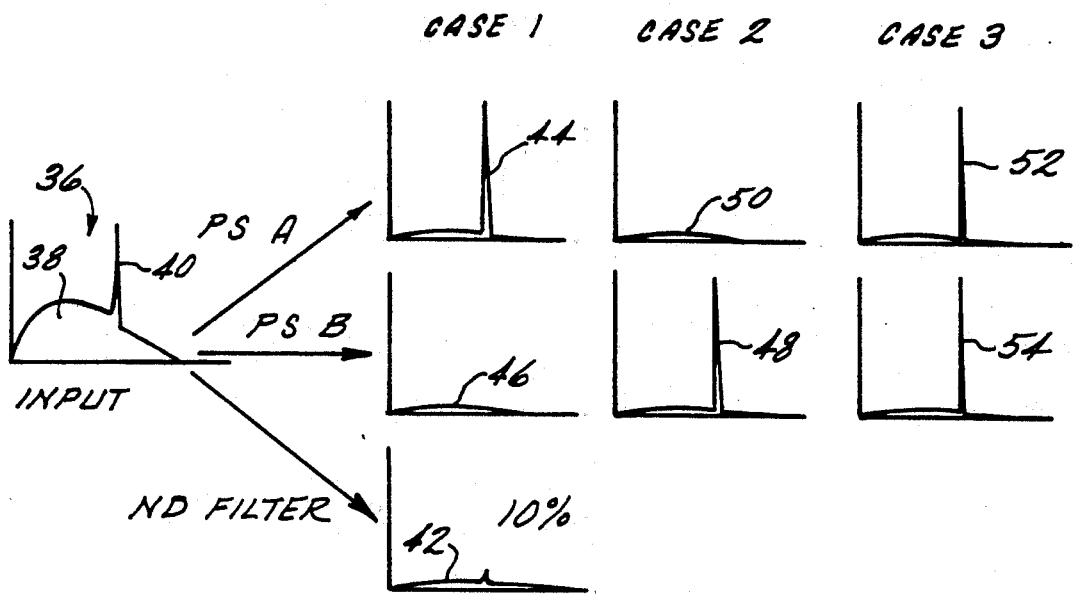
FIG. 6 is a diagrammatic view illustrating the detection logic for the laser sensor of FIG. 4.

This important feature of the FIG. 4 laser sensor is clearly seen in the spectrum analysis of FIG. 6. In FIG. 6, an input spectrum 36 includes a white light portion 38 and a laser portion 40. After passing through laser discrimination sensor 30, three cases are possible. In all cases, the incident light passing through each neutron density filter 12', or 12" will have the same spectrum 42 which is 10% of spectrum 36. In case 1, the laser wavelength will be, for example, at 497 nm and will therefore be completely transmitted (spectrum 44) through Sensor A; but not transmitted through Sensor B (spectrum 46). Thus, in Case 1, without using Sensor A, it would be difficult, if not impossible to discriminate between the white light and laser light transmittance. Similarly, Case 2 is valid for a laser wavelength of, for example 492 nm where there is high laser light transmittance in Sensor B (spectrum 48), but lower laser transmittance in Sensor A (spectrum 50). Finally, Case 3 relates to laser wavelengths which exhibit high transmittance for both Sensors A and B (spectrums 52 and 54, respectively). An example of Case 3 in the FIG. 4 embodiment would be a laser wavelength of 494 nm.

The sensitivity of the sensor system of this invention can be further increased if "active" materials are used to construct the photon sieve. Suitable "active" materials include piezoelectric materials such as quartz and electro-optic materials such as $BaTiO_3$, $BiSi_{12}O_{20}$, $LiNbO_3$ and SBN.

Figure 7:
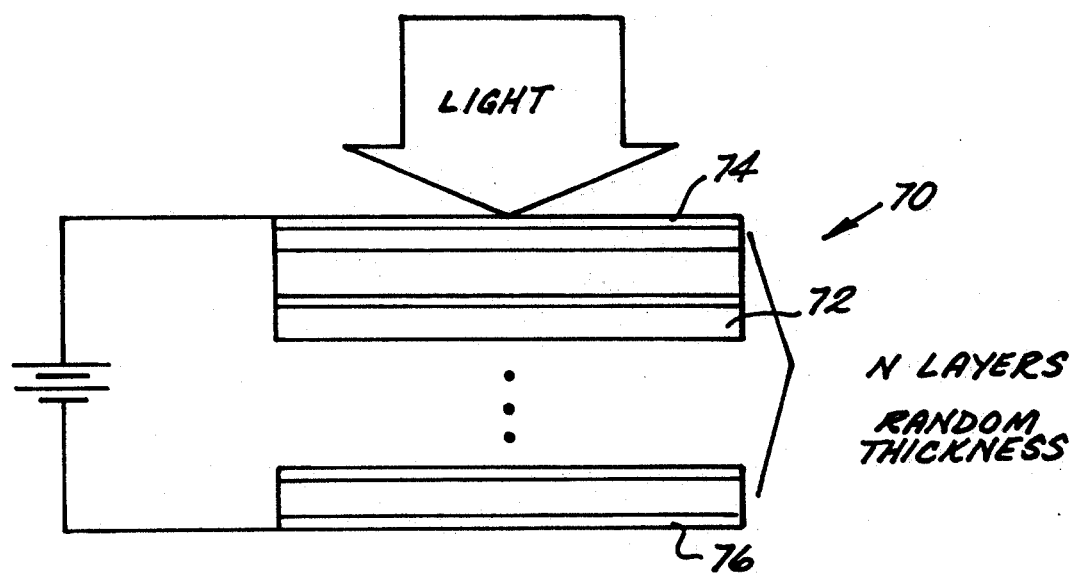
FIG. 7 is a schematic view of a laser sensor in accordance with the present invention which incorporates at least one "active" layer.

In a preferred embodiment, at least one of the layers in the multilayer stack is an active layer. Referring to FIG. 7, a multilayer stack in accordance with the present invention is shown generally at 70. Stack 70 includes at least one active layer 72. Active layer 72 is sandwiched between two thin transparent electrode layers 74 and 76. Transparent electrode layers 74, 76 may be made from any suitable material such as titanium oxide ($TiO_2$). Electrode layers 74, 76 may either be embedded in the photon sieve 70 or may be attached to the two outermost layers of the photon sieve as shown in FIG. 7. It will be appreciated that if the electrode layers 74, 76 are of suitable optical thickness, then said electrode layers can also be utilized as regular photon sieve layers.

By applying a periodic external electric field to electrodes 74, 76 as shown in FIG. 7, the optical thickness of the active layer 72 will be modulated. If a piezoelectric material is used, the physical thickness of layer 72 will be modulated. If an electro-optic material is used, then the refractive index of layer 72 will be modulated. The modulation in optical thickness causes a modulation in the transmittance for the laser light while the transmittance for background light remains constant. An important benefit derived from the photon sieve embodiment 70 of FIG. 7 is that a modulated signal resulting from multilayer stack 70 is much easier to detect electronically. Schemes for detecting signals at known modulating frequencies are well-known. For example, an electrical bandpass filter can be utilized. However, a potential drawback of the embodiment of FIG. 7 is that the response time must now be determined by the modulation frequency as well as the response time of the piezoelectric, electro-optic or other active materials utilized therein.

The previously discussed examples of FIGS. 1 and 2 comprise multiple thick layers of alternating high and low index materials. In accordance with still another embodiment of this invention, this stack of multiple layers is altered by removal of the thick high index of refraction layers and replacement thereof with a thin quarterwave layer. As will be discussed below, this alternative embodiment may be preferred over the earlier described embodiments.

Figure 8:
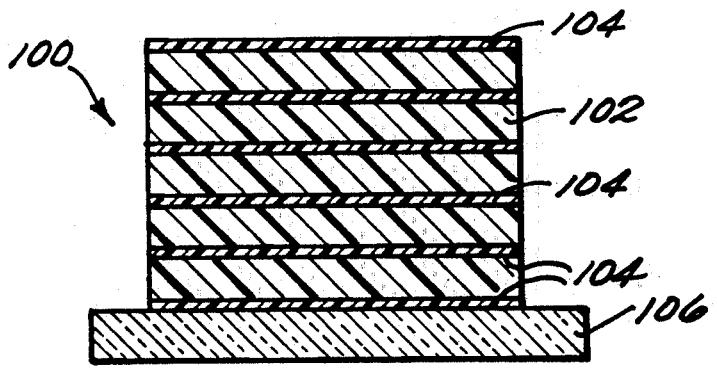
FIG. 8 is a cross-sectional schematic view depicting an alternative embodiment of the present invention utilizing thin high index layers.

Referring now to FIG. 8, this alternative is shown generally at 100 and includes a multilayer stack comprised of alternating "thick" layers 102 (100λ) of low index of refraction (e.g., 1.46 $SiO_2$) materials and "thin" layers 104 ($\frac{1}{4}$λ) of quarterwave materials such as $Ti_2O_3$ or ZnS. The two outer layers of multilayer stack 100 comprise high index of refraction quarterwave layers 104 with the entire stack being mounted on a substrate 106. Substrate 106 is preferably comprised of clear glass.

In well known thin film notation, the embodiment of FIG. 8 is "substrate/(H300L)5 H / Air". The thick low index layers 102 can be viewed as spacers that separate six partially reflecting mirrors formed by the quarterwave high index layers. Because the high index layer is only a quarterwave thick, it reflects both coherent light and incoherent light over a broad band of wavelength. Since these mirrors are separated by thick spacers, the secondary beams reflected by these mirrors will add up coherently only when the incident light is coherent. For incoherent input, the FIG. 8 embodiment behaves just like a stack of ordinary partially reflecting mirrors.

Because the photon sieve of FIG. 8 is an interference based device, the tolerance specifications are comparable to that of conventional multilayer thin film filters. To achieve specified performance, the layer thickness should be controlled within approximately 1/10 of the design value (a typical value for all thin film filters). The thickness variation (uniformity) over the clear aperture should also be within the same range. The existing techniques for fabricating conventional thin film filters are also applicable for making the photon sieve of FIG. 8. They include: thermal vapor evaporation, electron beam deposition, ion beam assisted deposition, chemical vapor deposition (CVD), plasma enhanced CVD, sputtering and MBE. The benefit of the FIG. 8 embodiment can be clearly seen from a manufacturing standpoint. For example, it is normally a very time consuming process to deposit a thick layer of high index materials such as $Ti_2O_3$. High index materials such as $Ti_2O_2$ or ZnS also have high intrinsic absorption. The thinner these layers, the lower the total absorption. Therefore, the embodiment of FIG. 8 (with thin high-index layers) is preferred. As already mentioned, another benefit is that thin layers are much easier to deposit, and also less time consuming thereby leading to easier fabrication and lower manufacturing costs.

It will be appreciated that the neutral density filters in FIGS. 3 and 4 have been shown for example only. The purpose of these filters is to provide a reference signal for comparison with the output from the photon sieve. Such comparison can also be achieved by using any other known referencing means. For example, the filters can be optical windows of known transmittance with the compensation (e.g., reduction in transmittance) being carried out electronically.

It will also be appreciated that the FIG. 4 embodiment may utilize a single reference filter 16' which is shared by both Sensors A and B. In this latter embodiment, only a single photodetector 18' is required.

In Siebert U.S. Pat. No. 4,536,089, Siebert discloses a Fabry-Perot etalon interferometer that is an improvement over an earlier configuration described in Crane U.S. Pat. 3,824,018. The main benefit of the Siebert configuration (relative to Crane) as shown in FIG. 12 of Siebert is to provide immunity to atmospheric induced intensity scintillation (see Siebert, col. 13, lines 53-55). FIG. 12 also shows a reflective layer 144. The purpose of the reflective layer is to increase the reflectivity of the two layers of the Fabry-Perot interferometer. The need for this reflective layer 144 is made clear from a review of the prior art Fabry-Perot interferometer described in Crane U.S. Pat. No. 3,824,018. As disclosed by Crane (col. 2, lines 47-50), the Fabry-Perot interferometer requires a reflectivity of 40-60% for each layer. Assuming that the substrate 142 (FIG. 12 of Siebert) is made of a material with a refractive index of 1.5 and the spacer layer 146 is simply an air-gap, without a reflective layer 144, the reflectivity is only about 4% for each surface. Therefore, Siebert describes the necessity for using a reflective layer 144.

The reflective layer 144 in Siebert can be a single very thin metallic (e.g., aluminum) layer, or extremely thin dielectric multilayer stacks (see Crane Patent, Col. 2, lines 50-55). Thin dielectric multilayer stacks are well-known methods for increasing the reflectivity of an optical surface. The typical optical thickness of these thin multilayer stacks is about $\frac{1}{4}$ wavelength. These multilayer stacks do not discriminate between coherent and incoherent radiation. In distinct contrast to the present invention, the reflective layer 142 in FIG. 12 of Siebert are solely for the purpose of increasing the reflectivities of the Fabry-Perot layers, not for discriminating coherent radiation as in this invention. In the present invention, the "thick" multilayer stack is the discrimination device.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A laser discrimination device for discriminating between ambient light and laser light, said ambient light having a coherence length and said laser light having a coherence length, comprising:
   a plurality of layers arranged in a multilayer stack, said layers each having an optical thickness which is greater than the coherence length of ambient light, said optical thickness of each of said layers also being substantially smaller than the coherence length of laser light.

2. The device of claim 1 wherein:
said optical thickness of said layers is about 5-100 microns.

3. The device of claim 1 wherein:
said layers alternate between high refractive index layers and low refractive index layers.

4. The device of claim 1 wherein:
at least one of said layers comprise an active material whose optical thickness is modulated by application of a periodic external electric field.

5. The device of claim 4 wherein:
said active material is selected from the group consisting of piezoelectric materials and electro-optic materials.

6. A laser sensor device for sensing the presence or absence of laser light superimposed on ambient light, said ambient light having a coherence length and said laser light having a coherence length, comprising:
a laser discrimination filter including a plurality of layers arranged in a multilayer stack, each of said layers having an optical thickness which is greater than the coherence length of the ambient light, the optical thickness of each of said layers also being substantially smaller than the coherence length of the laser light;
reference filter means;
first photodetector means for detecting the transmitted light through said laser discrimination filter;
second photodetector means for detecting the transmitted light through said reference filter means;
comparator means for comparing the outputs from said first and second photodetector means and determining the presence or absence of laser light.

7. The device of claim 6 wherein:
said laser discrimination filters and said reference filter means are coplanar.

8. The device of claim 6 wherein:
said comparator means comprises differential amplifier means.

9. The device of claim 6 wherein:
said optical thickness of each of said layers is about 5-100 microns.

10. The device of claim 6 wherein:
said reference filter means comprises a neutral density filter having a transmittance equal to the transmittance of said laser discrimination filter for ambient light.

11. The device of claim 6 wherein:
said reference filter means comprises an optical window having a known transmittance.

12. The device of claim 6 wherein:
said layers alternate between high refractive index layers and low refractive index layers.

13. The device of claim 6 wherein:
at least one of said layers comprise an active material whose optical thickness is modulated by application of a periodic external electric field.

14. The device of claim 13 wherein:
said active material is selected from the group consisting of piezoelectric materials and electro-optic materials.

15. A laser sensor device for sensing the presence or absence of laser light superimposed on ambient light, said ambient light having a coherence length and said laser light having a coherence length, comprising:
(a) first sensor means, said first sensor means including;
a first laser discrimination filter including a plurality of layers arranged in a multilayer stack, said layers each having an optical thickness which is greater than the coherence length of the ambient light, said optical thickness of each of said layers also being substantially smaller than the coherence length of the laser light;
first reference filter means;
first photodetector means for detecting the transmitted light through said first laser discrimination filter;
second photodetector means for detecting the transmitted light through said first reference filter means;
first comparator means for comparing the outputs from said first and second photodetector means and delivering a first comparison output signal;
(b) second sensor means, said second sensor means including;
a second laser discrimination filter including a plurality of layers arranged in a multilayer stack, said layers each having an optical thickness which is greater than the coherence length of the ambient light, said optical thickness of each of said layers also being substantially smaller than the coherence length of the laser light;
second reference filter means;
third photodetector means for detecting the transmitted light through said second laser discrimination filter;
fourth photodetector means for detecting the transmitted light through said second reference filter means;
second comparator means for comparing the outputs from said third and fourth photodetector means and delivering a second comparison output signal; and
(c) OR logic means for comparing said first and second comparison output signals and determining the presence or absence of laser light.

16. The device of claim 15 wherein:
said first and second reference filter means comprise a single unit.

17. The device of claim 15 wherein:
said second and fourth photodetector means comprise a single unit.

18. The device of claim 16 wherein:
said second and fourth photodetector means comprise a single unit.

19. The device of claim 15 wherein:
said first and second laser discrimination filters and said first and second reference filter means are coplanar.

20. The device of claim 15 wherein:
said first and second comparator means comprise differential amplifier means.

21. The device of claim 15 wherein:
said average optical thickness of said layers is about 5-100 microns.

22. The device of claim 15 wherein:
said layers alternate between high refractive index layers and low refractive index layers.

23. The device of claim 15 wherein:
said wavelength characteristics of said first laser discrimination filter is offset from said wavelength characteristics of said second laser discrimination filter.

24. The device of claim 15 wherein:

said reference filter means comprises a neutral density filter having a transmittance equal to the transmittance of said laser discrimination filter for ambient light.

25. The device of claim 15 wherein:

said reference filter means comprises an optical window having a known transmittance.

26. The device of claim 15 wherein:

at least one of said layers comprise an active materials whose optical thickness is modulated by application of a periodic external electric field.

27. The device of claim 26 wherein:

at least one of said layers comprise an optically active material whose optical thickness is modulated by application of a periodic external electric field.

28. A laser discrimination device for discriminating between ambient light and laser light, said ambient light having a coherence length and said laser light having a coherence length, comprising:

a plurality of layers arranged in a multilayer stack, said layers alternating between high refractive index layers and low refractive index layers, said low refractive index layers each having an optical thickness which is greater than the coherence length of ambient light, said optical thickness of each of each of said low refractive index layers also being substantially smaller than the coherence length of laser light.

29. The device of claim 28 wherein:

said optical thickness of said low refractive index layers is about 5–100 microns.

30. The device of claim 28 wherein:

said high and low refractive index layers are deposited using a thin film technique.

31. The device of claim 28 wherein:

said high refractive index layers each have an optical thickness of one quarter of a selected average wavelength.

32. The device of claim 31 wherein:

said high and low refractive index layers are deposited using a thin film technique.

33. The device of claim 28 including:

an optically clear substrate, said multilayer stack being mounted on said substrate.

34. The device of claim 28 wherein:

said multilayer stack includes a pair of outer layers, said outer layers comprising high refractive index layers.

* * * * *